(12) United States Patent  
Ohtani et al.

(10) Patent No.: US 6,690,031 B1
(45) Date of Patent: Feb. 10, 2004

(54) SEMICONDUCTOR DEVICE AND METHOD OF MANUFACTURING THE SAME

(75) Inventors: Hisashi Ohtani, Kanagawa (JP); Misako Nakazawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/294,335

(22) Filed: Apr. 20, 1999

(30) Foreign Application Priority Data

Apr. 28, 1998 (JP) .......................................... 10-119055

(51) Int. Cl.$^7$ .............................................. H01L 29/04
(52) U.S. Cl. .............................. 257/71; 257/72; 257/59; 257/350; 257/353; 257/68
(58) Field of Search ................................ 257/59, 72, 71, 257/353, 350, 68; 349/38, 39

(56) References Cited

U.S. PATENT DOCUMENTS

| | | | | |
|---|---|---|---|---|
| 4,639,087 A | * | 1/1987 | Cannella | ..................... 350/332 |
| 4,728,175 A | * | 3/1988 | Baron | ......................... 350/336 |
| 4,759,610 A | * | 7/1988 | Yanagisawa | ................ 350/334 |
| 5,056,895 A | * | 10/1991 | Kahn | ........................... 359/87 |
| 5,182,620 A | * | 1/1993 | Shimada et al. | .............. 257/72 |
| 5,182,661 A | * | 1/1993 | Ikeda et al. | .................... 359/54 |
| 5,193,017 A | * | 3/1993 | Iwai et al. | ..................... 359/59 |
| 5,317,432 A | * | 5/1994 | Ino | ............................... 359/59 |
| 5,648,277 A | | 7/1997 | Zhang et al. | |
| 5,668,613 A | * | 9/1997 | Kim et al. | .................... 349/38 |
| 5,686,976 A | * | 11/1997 | Nishikawa | ................... 349/38 |
| 5,745,195 A | | 4/1998 | Zhang | |
| 5,767,827 A | * | 6/1998 | Kobayashi et al. | ........... 345/87 |
| 5,777,702 A | * | 7/1998 | Wakagi et al. | ................ 349/47 |
| 5,834,328 A | * | 11/1998 | Jang | .............................. 438/30 |
| 6,078,365 A | * | 6/2000 | Ueda et al. | .................... 349/43 |
| 6,137,551 A | * | 10/2000 | Jeong | .......................... 349/38 |
| 6,313,481 B1 | * | 11/2001 | Ohtani et al. | |

FOREIGN PATENT DOCUMENTS

| | | | | |
|---|---|---|---|---|
| EP | 604006 | | 6/1994 | |
| EP | 682282 | | 11/1995 | |
| EP | 811869 | | 12/1997 | |
| JP | 56-17381 | | 2/1981 | |
| JP | 58-159518 | | 9/1983 | |
| JP | 1-140129 | | 6/1989 | |
| JP | 3-9328 | | 1/1991 | |
| JP | 404086809 | * | 3/1992 | ................ 349/138 |
| JP | 06-148684 | | 5/1994 | |
| JP | 6-258669 | | 9/1994 | |
| JP | 7-92491 | | 4/1995 | |
| JP | 07-135318 | | 5/1995 | |
| JP | 8-43854 | | 2/1996 | |
| JP | 8-306926 | | 11/1996 | |

OTHER PUBLICATIONS

Related Application Ser. No. 09/956,946; Hisashi Ohtani et al.; "Semiconductor Device and Method of Manufacturing the Same;" filed Sep. 21, 2001.

* cited by examiner

Primary Examiner—B. William Baumeister
Assistant Examiner—Eugene Lee
(74) Attorney, Agent, or Firm—Eric J. Robinson; Robinson Intellectual Property Law Office, P.C.

(57) ABSTRACT

An electro-optical device including an auxiliary capacitance using a pair of transparent conductive films is improved to provide a semiconductor device with high quality. A first transparent conductive film and a capacitance insulating film are formed into a laminate on a leveling film, and an opening portion is formed. An insulating film is formed thereon, and a second transparent conductive film is patterned to form a pixel electrode. At this time, the auxiliary capacitance made of a structure in which the capacitance insulating film is sandwiched between the first transparent conductive film and the pixel electrode is formed.

32 Claims, 9 Drawing Sheets

SEMICONDUCTOR DEVICE AND METHOD OF MANUFACTURING THE SAME

BACKGROUND OF THE INVENTION

1. Field of the Invention

The present invention relates to a structure of an electro-optical device typified by a liquid crystal display device, and an electronic equipment incorporating such an electro-optical device as its part. Incidentally, in the present specification, the term "semiconductor device" means any device capable of functioning by using semiconductor characteristics, and the electro-optical device and the electronic equipment are also included in the category of the semiconductor device.

2. Description of the Related Art

In recent years, attention has been paid to an active matrix type liquid crystal display device in which a circuit is constructed by thin film transistors (hereinafter referred to as TFT) using a polysilicon film. This is to control, in a matrix, an electric field applied to a liquid crystal by a plurality of pixels arranged in a matrix and to realize picture display with high definition.

In such an active matrix type liquid crystal display device, a capacitance (condenser) is made of a pixel electrode formed for each pixel and an counter electrode formed at an opposite side through a liquid crystal. However, since the capacitance of this alone is small, an auxiliary capacitance (also called Cs) is generally formed in addition to that to supplement the deficiency.

Although the auxiliary capacitance has various structures (Cs structures), there is reported a structure in which an insulating film is sandwiched between two layers of transparent conductive films in view of an opening ratio in a transmission type liquid crystal display device (Japanese Patent Laid-open No. Hei 8-43854 and No. Hei 8-306926, which are incorporated therein by reference).

The foregoing publications state that in the Cs structure, with the use of the transparent conductive films such as ITO as a pair of electrodes constituting the auxiliary capacitance, large capacitance can be secured without impairing an opening ratio.

Figure 2:
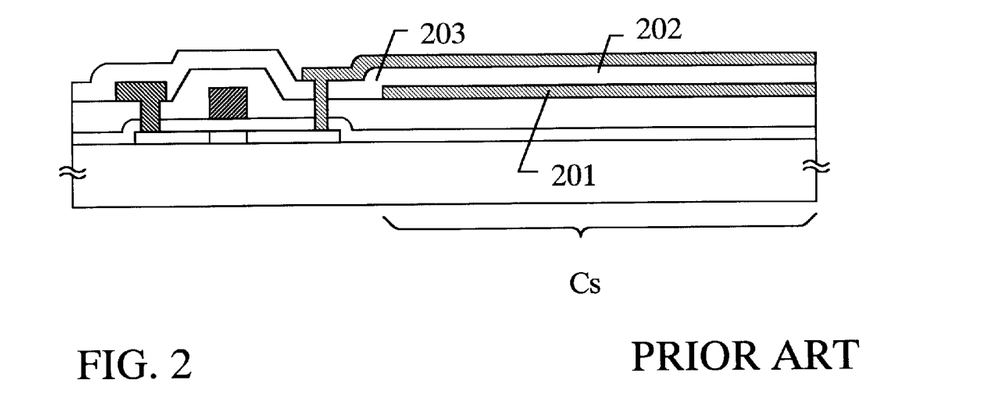
FIG. 2 is a view showing a conventional sectional structure of a pixel and an auxiliary capacitance.

In the above-mentioned publications, although an interlayer insulating film serves also as a dielectric of the auxiliary capacitance, a film thickness to a certain degree is required in order to meet the function as the interlayer insulating film. That is, as shown in FIG. 2, since an interlayer insulating film 202 is formed so as to cover a capacitance electrode 201 made of a transparent conductive film, there must be at least assured such a thickness that poor coverage does not occur at an end 203.

Besides, as a transparent conductive film has resistance higher than a metal film, a thickness of about 100 to 200 nm becomes necessary for the thickness of the capacitance electrode 201, also considering the distribution of electric potential. Thus, in order to completely cover the capacitance electrode 201, the insulating film with a thickness of at least 200 nm becomes necessary. However, since the magnitude of capacitance is in inverse proportion to the film thickness of a dielectric, it is not desirable to increase the film thickness in view of securing high capacitance.

As described above, when the insulating film is sandwiched between a pair of transparent conductive films, it becomes possible to enlarge the area in which the auxiliary capacitance can be formed without impairing the opening ratio. However, the recent situation is that there are still many problems.

SUMMARY OF THE INVENTION

The present invention has been made to solve the foregoing problems, and an object of the invention is to further improve an electro-optical device including an auxiliary capacitance using a pair of transparent conductive films. Another object of the present invention is to provide a semiconductor device of superior quality.

According to an aspect of the present invention, a semiconductor device comprising a plurality of pixels arranged in matrix and an auxiliary capacitance disposed for each of the plurality of pixels, characterized in that the auxiliary capacitance has a structure in which a first transparent conductive film, a capacitance insulating film, and a second transparent conductive film are sequentially stacked on each other, and the first transparent conductive film and the capacitance insulating film have the same pattern shape.

The first transparent conductive film and the capacitance insulating film can be sequentially etched with the same mask when an etchant (or etching gas) capable of etching both the films is used. In that case, the first transparent conductive film and the capacitance insulating film have opening portions with the same shape. The opening portions are covered with a resin material patterned by patterning.

At this time, the resin material can be formed by a resin material (black resin material, etc.) with light-shielding property or a laminated structure of a resin material with light-shielding property and a transparent resin material (acryl, polyimide, etc.).

According to another aspect of the present invention, a method of manufacturing a semiconductor device comprises the steps of: forming a laminate of a first transparent conductive film and a capacitance insulating film on a first interlayer insulating film covering a TFT; forming opening portions with the same shape in the first transparent conductive film and the capacitance insulating film, respectively, by etching the first transparent conductive film and the capacitance insulating film; forming a second interlayer insulating film made of a resin material so as to cover the opening portions; removing the second interlayer insulating film formed at a place where an auxiliary capacitance is to be formed later and at the opening portions; forming a contact hole by etching the first interlayer insulating film exposed at the opening portions; forming a second transparent conductive film connected to the TFT; and forming a pixel electrode by patterning the second transparent conductive film, wherein the auxiliary capacitance is formed of the first transparent conductive film, the capacitance insulating film, and the pixel electrode.

In the above-mentioned structure, by etching the first transparent conductive film and the capacitance insulating film is sequentially, and an making opening portion provided in the capacitance insulating film larger in a diameter larger than an opening portion provided in the first transparent conductive film, a step-like opening portion can be formed, too.

DETAILED DESCRIPTION OF THE PREFERRED EMBODIMENTS

Figure 1:
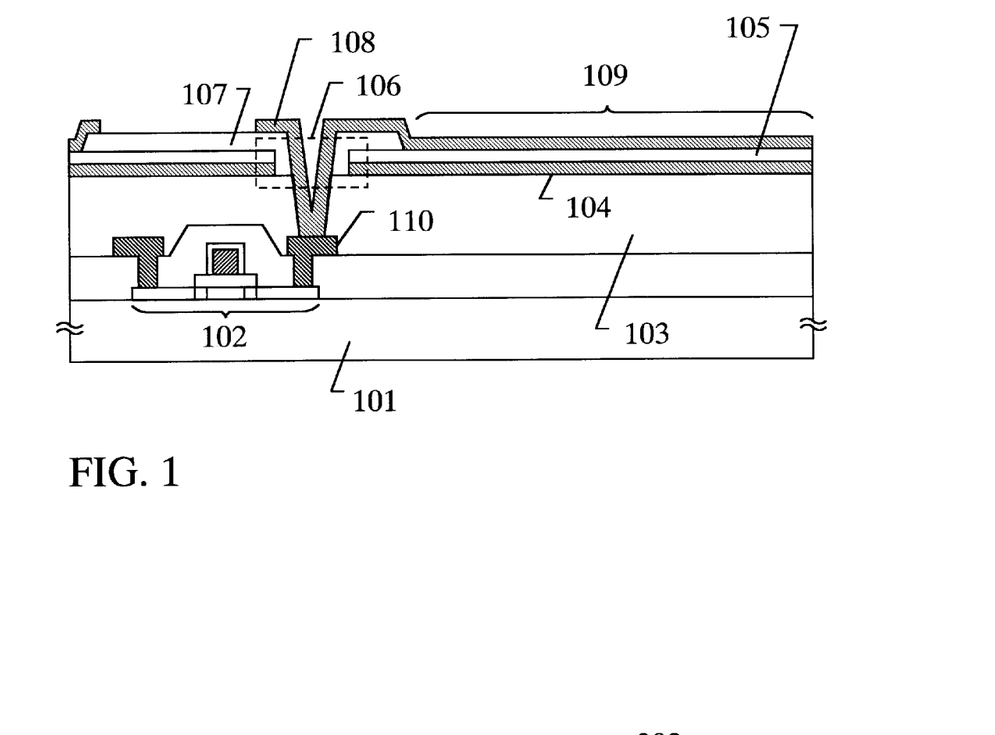
FIG. 1 is a view showing a sectional structure of a pixel and an auxiliary capacitance of Embodiment 1.

Embodiment modes of a liquid crystal display device using the present invention will be described with reference to FIG. 1. FIG. 1 is a sectional view showing a plurality of pixels arranged in a matrix and an auxiliary capacitance provided for each of the pixels.

In FIG. 1, reference numeral 101 denotes a substrate having an insulating surface, and a TFT 102 formed by well-known means is formed thereon. A leveling film (first interlayer insulating film) 103 is formed so as to cover the TFT 102. Although any insulating film may be used for the leveling film 103, it is preferable to use a resin material such as polyimide or acryl to realize high flatness.

A first transparent conductive film 104 and a capacitance insulating film 105 are sequentially stacked on the leveling film 103. It is appropriate that tin oxide, ITO (Indium Tin Oxide) or the like is used for the first transparent conductive film 104. The first transparent conductive film 104 functions as a lower electrode of the auxiliary capacitance.

A transparent insulating film, such as silicon oxide, silicon nitride, silicon nitride oxide, tantalum oxide, aluminum oxide (alumina) is used for the capacitance insulating film 105. Since the capacitance insulating film 105 functions as a dielectric of the auxiliary capacitance and is formed in the entire region of the pixel, the insulating film having high transmittance is preferable.

In the present invention, as the area of the auxiliary capacitance can be secured large and the thickness of the dielectric can be lessened (described later), an insulating film with very high relative dielectric constant is not required. Thus, an optimum insulating film can be selected while giving highest priority to increase the transmittance, so that bright picture display can be obtained.

An opening portion 106 is formed in the laminated structure made of the first transparent conductive film 104 and the capacitance insulating film 105. This is a connection portion (called a drain connection portion) for connecting a pixel electrode and a drain electrode later.

At this time, if dry etching is carried out by using an etching gas capable of etching both the first transparent conductive film 104 and the capacitance insulating film 105, as shown in FIG. 1, the end face of the first transparent conductive film and the end face of the capacitance insulating film exposed at the opening portion 106 become almost flush with each other. Beside, if wet etching is carried out with an etchant capable of etching both the films, the same thing can be said.

If etching is carried out in such a condition that an etching rate of the capacitance insulating film 105 is faster, the diameter of the opening portion provided in the capacitance insulating film becomes larger than the opening portion provided in the first transparent conductive film, so that a step-like opening portion can be formed, too.

Then an insulating film 107 with low relative dielectric constant is formed so as to cover the opening portion 106, and the insulating film 107 is patterned. In the patterning step, only portions of the insulating film 107 formed at a place where the auxiliary capacitance is to be formed and at the drain connection portion are selectively removed to form a contact hole in the drain connection portion (opening portion 106) and at the same time, to expose the capacitance insulating film 105.

A pixel electrode 108 made of a second transparent conductive film is formed thereon. This pixel electrode 108 is in contact with the capacitance insulating film 105 in the pixel, and an auxiliary capacitance 109 made of the first transparent conductive film/capacitance insulating film/second transparent conductive film can be formed.

The pixel electrode 108 is electrically connected to a drain electrode 110 of the TFT 102, and a voltage applied to the pixel electrode 108 is controlled by the TFT 102. Incidentally, although FIG. 1 shows a structure in which the pixel electrode 108 is connected to the drain electrode 110, such a structure may be adopted that the pixel electrode 108 is directly connected to an active layer of the TFT 102.

In the structure shown in FIG. 1, the TFT 102 is completely shaded by a black mask provided at an opposite substrate side of the liquid crystal display device. This is to prevent irradiation of light to the active layer of the TFT 102.

The feature of the present invention structured as described above is that the thickness of the capacitance insulating film 105 (dielectric of the auxiliary capacitance) can be freely adjusted. In the conventional structure, a thickness of 200 nm or more is required in view of a problem of coverage. However, in the structure of the present invention, it is possible to form the film with a thickness of about 10 to 200 nm (preferably 50 to 100 nm). That is, the thickness of the capacitance insulating film 105 can be made smaller than the thickness of the first transparent conductive film 104.

The reason why the lower limit of the film thickness is 10 nm is because if the thickness is less than this, withstanding voltage is low and breakdown becomes apt to occur. Another reason is that if the thickness is less than this, it is difficult to secure a uniform thickness. In view of such reasons, it can be said that a thickness of about 50 to 100 nm is preferable.

Although there is basically no upper limit in the thickness of the capacitance insulating film 105, if the film thickness is excessively large, it becomes difficult to secure large capacitance and a throughput is decreased. Thus, it is necessary to suppress the film thickness to a certain degree of thickness. In such a sense, the applicant considers that the upper limit is 200 nm (preferably 100 nm).

Like this, that the film thickness of the dielectric of the auxiliary capacitance can be freely set is a very significant advantage. As is known generally, there is a condition (reflection preventing condition) where transmittance becomes high when thin films with different indexes of refraction are formed into a lamination. When index of refraction is n, film thickness is d, and wavelength of transmission light is $\lambda$, this relation is expressed by $nd=\lambda/4$.

In the present invention, since the degree of freedom concerning the selection of material and film thickness of a dielectric of an auxiliary capacitance is high, in the foregoing equation, adjustment of the term "nd" is easy. Thus, by controlling the film thickness of the respective lamination films to meet the reflection preventing condition, high transmittance can be realized, and a pixel region capable of effecting a bright picture display can be formed while functioning as the auxiliary capacitance.

In the case of the structure of the present invention, since the insulating film 107 is disposed between the pixel electrode 108 and the first transparent conductive film 104 in the opening portion 106, a short circuit does not occur between the pixel electrode 108 and the end face of the first transparent conductive film 104.

The present invention structured as described above will be described in more detail with the following embodiments described below.

Embodiment 1

An example of steps for manufacturing a liquid crystal display device, as a semiconductor device including the structure of the present invention, will be described with reference to FIGS. 3A to 3D.

First, as a substrate having an insulating surface, a glass substrate with a surface provided with an under film made of silicon oxide was prepared. Of course, other than the glass substrate, a quartz substrate (under film may not be provided) or a ceramic glass substrate may be used, or a silicon wafer on which a thermal oxidation film is formed may be used.

Figure 3A:
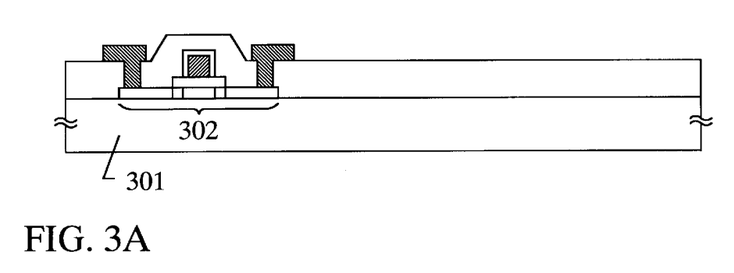
FIGS. 3A to 3D are views showing manufacturing steps of a pixel structure of Embodiment 1.

Next, a TFT 302 was completed by well-known means. In this embodiment, a technique disclosed in Japanese Patent Laid-open No. Hei 7-135318, which is incorporated therein by reference, by the present applicant was used. According to the technique disclosed in the publication, the TFT 302 with the structure as shown in FIG. 3A can be formed.

Figure 3B:
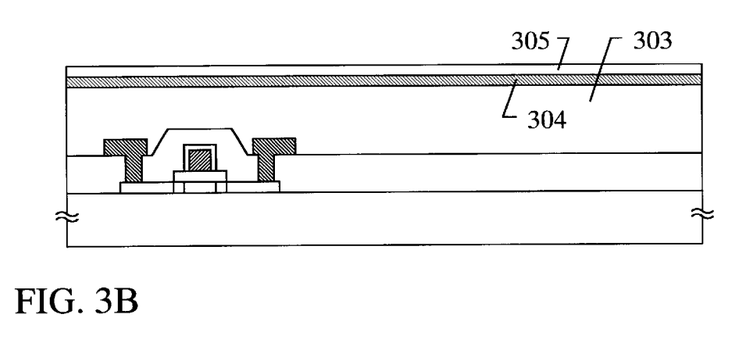

Next, a leveling film 303 was formed so as to cover the TFT 302. In this embodiment, although acryl was used for the leveling film 303, another resin material may be used. A first transparent conductive film 304 and a capacitance insulating film 305 were formed into a laminate on the leveling film 303 (FIG. 3B).

As the first transparent conductive film 304, an ITO (Indium Tin Oxide) film formed by a sputtering method and having a thickness of 100 nm was used. In this embodiment, ITO was used as a target, a mixture gas of argon and oxygen was used as a sputtering gas, and a film formation pressure was set at $3 \times 10^{-3}$ torr. The film formation was made with DC current control of 1.5 A, and the substrate temperature was made to room temperature.

In the case where a resin material is used as an under film (leveling film) as in this embodiment, a process which requires heating of a substrate is improper since degassing from the resin material becomes a problem. In that point, since film formation at room temperature can be made in the sputtering method, it is a preferable means.

As the capacitance insulating film 305, a silicon oxide film formed by the sputtering method and having a thickness of 50 nm was used. At this time, the advantage of the present invention is that the thickness of the capacitance insulating film 305 can be made smaller than the thickness of the first transparent conductive film 304.

In this embodiment, $SiO_2$ was used as a target, a mixture gas of argon (30 sccm) and oxygen (10 sccm) was used as a sputtering gas, and film formation pressure was set at $3 \times 10^{-3}$ torr. The film formation was carried out with RF power source control of 2000 W, and the substrate temperature was made to room temperature.

In this case, since the first transparent conductive film 304 has been already formed, there is no problem of degassing of the resin material. However, if the substrate temperature is high, there occurs a problem that the film quality of the first transparent conductive film 304 made of ITO becomes crystalline, so that etching becomes hard.

According to the knowledge of the present applicant, when the substrate temperature of the capacitance insulating film 305 becomes 180° C. or more, there has been obtained such a result that etching of the ITO film becomes difficult. On the other hand, if the substrate temperature is excessively lowered, the film quality of the capacitance insulating film 305 made of silicon oxide is degraded. That is, there occurs harmful effects such that the withstanding voltage becomes low.

According to an experimental result, it has been found that it is necessary to carry out film formation within the temperature range of 180° C. or lower (preferably 100 to 150° C.), and for that purpose, it can be said that the sputtering method is the most preferable method.

Of course, it is also possible to carry out film formation by a CVD method if the film formation can be made within the temperature range as set forth above. Besides, if the first transparent conductive film 304 and the capacitance insulating film 305 are continuously stacked on each other by using a mulch-chamber (cluster tool) system film formation apparatus and without exposing the films to the air, it is possible to prevent the short circuit of the auxiliary capacitance due to dust, or the like.

In this embodiment, although the silicon oxide film was used as the capacitance insulating film 305, a transparent insulating film other than that may be used. As the relative dielectric constant becomes high, sufficient capacitance can be secured even if the film thickness is increased. Thus, the production rate of defective by the short circuit can be further reduced. Of course, as described before, if the film thickness is excessively large, a throughput is decreased, so that it is appropriate that 200 nm is made the upper limit.

Figure 3C:
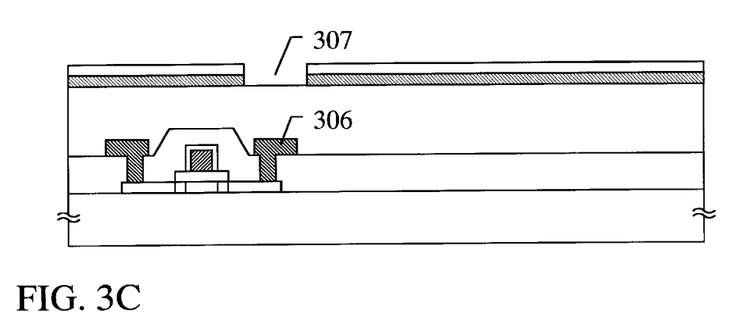

After the state of FIG. 3B was obtained in this way, an opening portion 307 was formed at a position where a contact hole for electrically connecting a drain electrode 306 and a pixel electrode (not shown) was to be formed later. It is preferable that the diameter of the opening portion 307 is made sufficiently larger than the diameter of the contact hole formed later. By this, it is possible to prevent a short circuit between the first transparent conductive film 304 and the pixel electrode (FIG. 3C).

In this embodiment, the opening portion 307 was formed with a margin of 3 $\mu$m to the diameter of the contact hole. When the radius of the contact hole is r $\mu$m, it can be said that r+3 $\mu$m is sufficient for the radius of the opening portion.

In the formation of the opening portion 307, the capacitance insulating film 305 and the first transparent conductive film 304 were sequentially etched by using the same resist mask, and opening portions with the same shape were formed in the films, respectively. That is, patterning was carried out so that the capacitance insulating film 305 and the first transparent conductive film had the same shape.

In this embodiment, buffered hydrofluoric acid was used for the etching of the capacitance insulating film 305 (silicon oxide film) and the first transparent conductive film (ITO film) 304. Since the silicon oxide film and the ITO film have almost the same etching rate to buffered hydrofluoric acid, the opening portions provided in both were made in the same shape.

At this time, if the capacitance insulating film has a faster etching rate, a step-like opening portion can be formed and an opening portion with excellent coverage can be formed. It is possible to adjust such a condition according to the kind of an etchant, film quality of the capacitance insulating film and the first transparent conductive film, and the like. Of course, it is also possible to carry out patterning two times, so that etching steps are separately carried out.

Figure 3D:
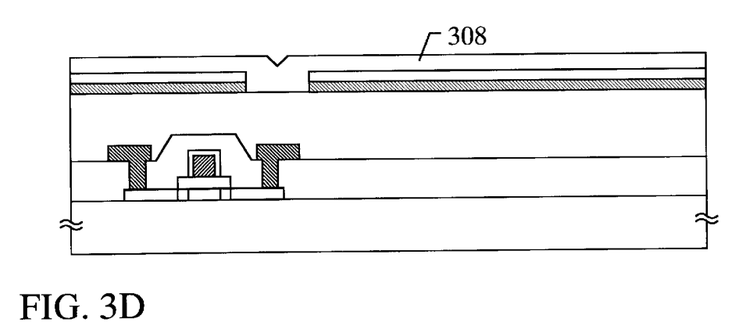

Next, an interlayer insulating film (second interlayer insulating film) 308 with low relative dielectric constant was formed to cover the capacitance insulating film 305 and the opening portion 307. Although acryl with a relative dielectric constant of 3.2 was used for the interlayer insulating film 308, any material may be used as long as its relative dielectric constant is 4 or less (preferably 3.5 or less) (FIG. 3D).

After the interlayer insulating film 308 was formed, patterning was carried out so that the interlayer insulating film 308 had been formed at a place where the auxiliary capacitance was to be formed later was removed. The place where the auxiliary capacitance is formed is almost coincident with a picture display region (pixel).

In this state, since the opening portion 307 described above was covered with the patterned interlayer insulating film (preferably resin material) 309, it was possible to prevent occurrence of a short circuit between the pixel electrode and the end face of the first transparent conductive film.

Figure 4A:
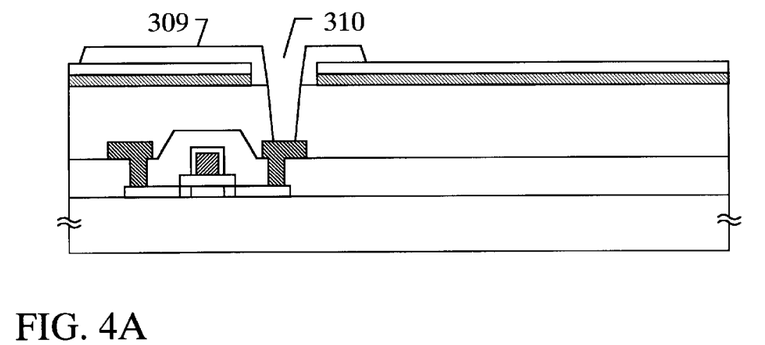
FIGS. 4A and 4B are views showing manufacturing steps of the pixel structure of Embodiment 1.

At the same time, in a region where the opening portion 307 was formed, a contact hole 310 for connecting the pixel electrode (not shown) and the drain electrode 306 was formed (FIG. 4A).

In this step, first, a resist mask (not shown) was formed at a predetermined position of the interlayer insulating film 308 and etching was carried out, so that the patterned interlayer insulating film 309 was formed. Then, the resist mask was used as it was, and the leveling film 303 was etched to form the contact hole. At this time, if such a condition is adopted that the side wall of the contact hole is tapered, it is possible to prevent discontinuity of the pixel electrode.

Figure 4B:
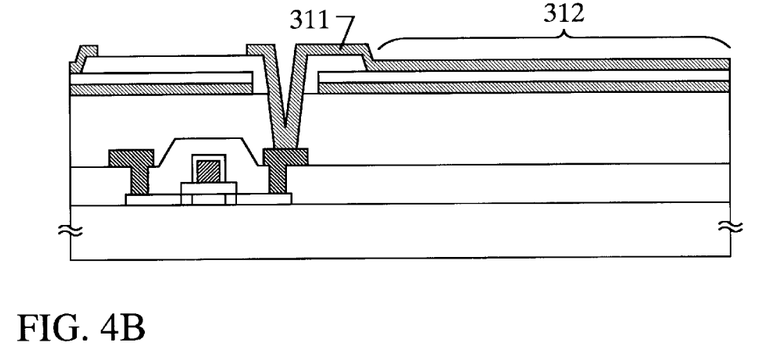

As a second transparent conductive film, an ITO film with a thickness of 120 nm was formed, and patterning was carried out so that a pixel electrode 311 was formed. At a place where this pixel electrode 311 was in contact with the capacitance insulating film 305, it was possible to form an auxiliary capacitance 312 with the capacitance insulating film sandwiched between the two layers of the transparent conductive films.

Figure 5:
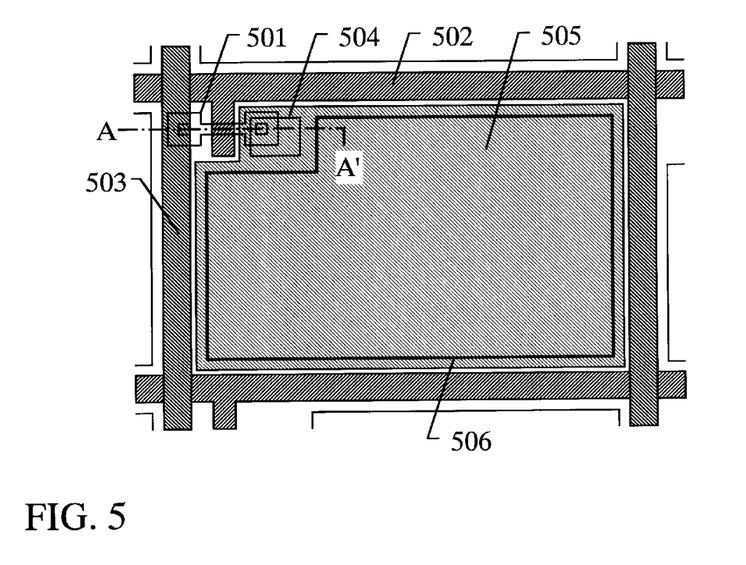
FIG. 5 is a top view of the pixel structure of Embodiment 1.

FIG. 5 is a top view of a pixel in the state where the auxiliary capacitance 312 was formed in this way. FIG. 4B is equivalent to a sectional view taken along A–A' of FIG. 5.

In FIG. 5, reference numeral 501 denotes an active layer made of a semiconductor thin film, 502 denotes a gate wiring line, and its portion where the gate wiring line overlaps with the active layer 501 is especially called a gate electrode. Reference numeral 503 denotes a source wiring line, and 504 denotes a drain electrode.

Reference numeral 505 denotes a pixel electrode made of the second transparent conductive film. The first transparent conductive film (not shown) and the capacitance insulating film (not shown) are formed into a laminate under the pixel electrode. In the structure of FIG. 5, a region 506 encircled with a thick line is a region forming the three-layer structure of the first transparent conductive film/capacitance insulating film/second transparent conductive film, and functions as the auxiliary capacitance.

The pixel structure of this embodiment as described above has an advantage that the region which becomes the auxiliary capacitance occupies almost the entire region in the pixel, so that substantially the same area as the picture display region can be secured.

Especially, the feature of the structure of this embodiment is that the first transparent conductive film and the capacitance insulating film are formed into a laminate, so that the thickness of the capacitance insulating film is made as small as 10 to 200 nm (preferably 50 to 100 nm).

Thus, since the ratio of the capacitance formation area is large, and the auxiliary capacitance with the thin dielectric film can be formed, even if relative dielectric constant is not very high, sufficient capacitance can be obtained. This means that the degree of freedom concerning the selection of materials is greatly improved.

As a result, it is also possible to select a material while giving priority to high transmittance characteristic, or it is also possible to realize high transmittance by suitably combining the film thickness of the transparent conductive film and the capacitance insulating film to have the reflection preventing effect. In that point, in the conventional structure, since the material and thickness of a dielectric is restricted to some degree, the degree of such freedom is low.

Incidentally, FIG. 4B shows a state in which the TFT formation side substrate (active matrix substrate) of the liquid crystal display device is almost completed. Actually, there is a step of forming an oriented film so as to cover the pixel electrode.

Figure 6:
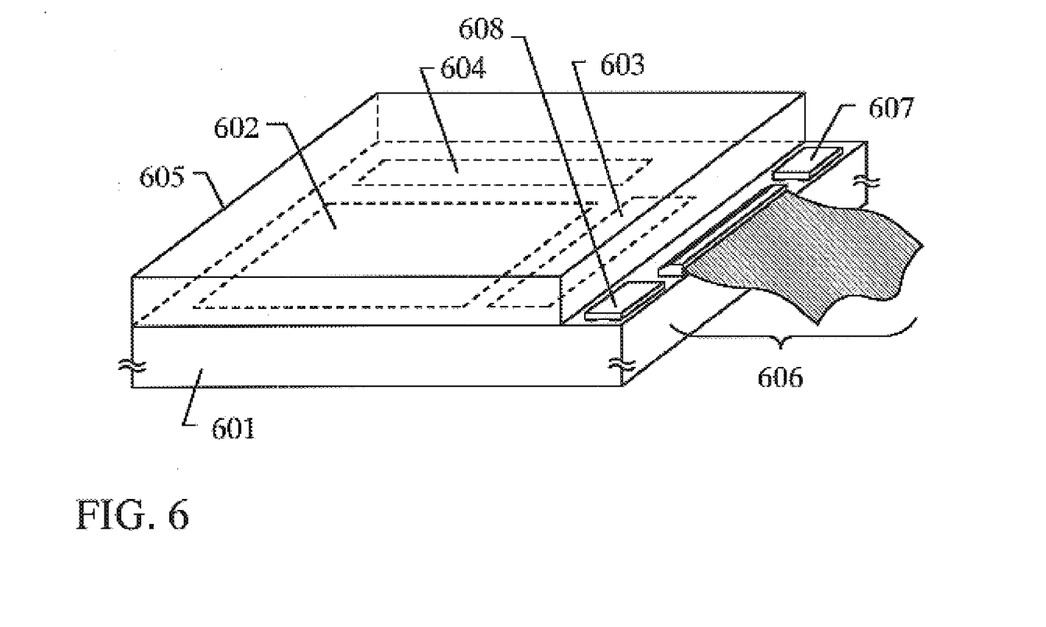
FIG. 6 is a view showing an external appearance of an active matrix type liquid crystal display device of Embodiment 1.

An opposite substrate provided with an counter electrode and an oriented film is prepared, and when a liquid crystal material is sealed into a portion between the active matrix substrate and the opposite substrate, the active matrix type liquid crystal display device with a structure as shown in FIG. 6 is completed. Since a step of sealing the liquid crystal material can be realized by a well-known cell assembling step, its detailed description will be omitted.

In FIG. 6, reference numeral 601 denotes a substrate having an insulating surface, 602 denotes a pixel matrix circuit, 603 denotes a source driver circuit, 604 denotes a gate driver circuit, 605 denotes an opposite substrate, 606 denotes an FPC (Flexible Printed Circuit), and 607 and 608 denote external IC chips.

The IC chips 607 and 608 may be attached as the need arises, and in some case, it does not matter if a circuit having an equivalent function, instead of the IC chips, is integrally formed with the source driver circuit, the gate driver circuit or the like. That is, a signal processing circuit such as a D/A converter or a γ correction circuit may be constituted by TFTs.

In this embodiment, although the description has been made on the liquid crystal display device as an example, it is needless to say that the present invention can be applied also to an EL (electroluminescence) display device or an EC (electrochromics) display device as long as the display device is an active matrix type display device.

Embodiment 2

Figure 7:
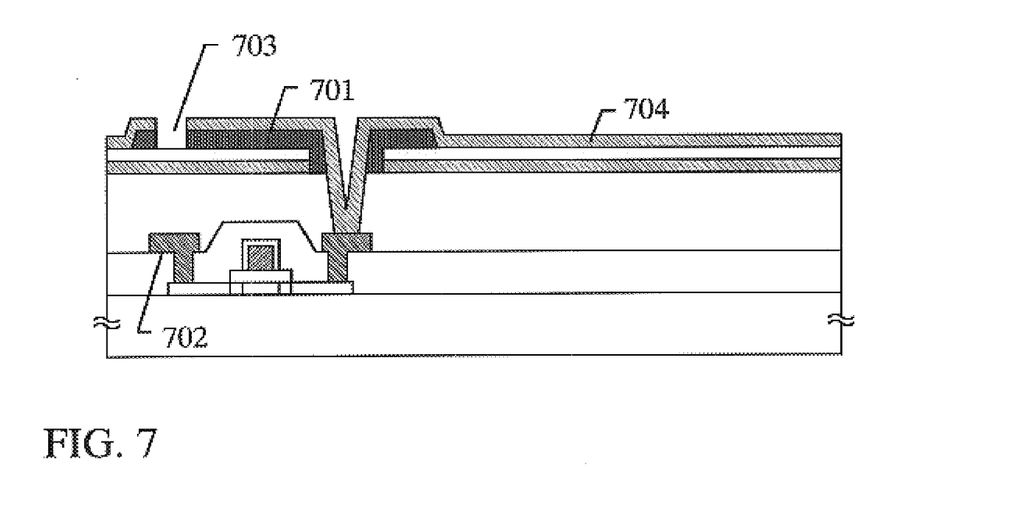
FIG. 7 is a view showing a sectional structure of a pixel and an auxiliary capacitance of Embodiment 2.

In this embodiment, in the structure shown in FIG. 1, the insulating film 107 is made of a resin material (typically a black resin material) having light-shielding property, and the portion is actively used as a black mask. The structure of this embodiment is shown in FIG. 7. Incidentally, the structure of this embodiment is a modification of the embodiment 1 in which the material of the insulating film 107 is merely changed, and this structure is easily combined with the embodiment 1.

Although the structure shown in FIG. 7 is basically the same as the structure shown in FIG. 1, there is a difference that an interlayer insulating film is formed of a black resin material 701. As the black resin material 701, although a resin material dispersed with black pigment, metal (titanium, chromium, etc.) material, or carbon-based material (graphite, etc.) may be used, in order to actively use it as a black mask, it is desirable that an OD value is 3 or more. In this embodiment, a resin material (OD value is 3) dispersed with graphite was used.

Incidentally, the OD value is an index indicating light-shielding property of a thin film, and is expressed by $OD=-\log_{10}T$ (T is transmittance and when transmittance is 0.1% T=0.001 is substituted). That is, the OD value signifies that as its absolute value becomes high, transmittance becomes high.

Like this, when the black resin material was used, it became possible to cover a TFT, source wiring line, and gate wiring line with the black interlayer insulating film, and it was directly used as the black mask. That is, when the technique of this embodiment is used, steps can be simplified.

However, since the black resin material functions also as the interlayer insulating film, it is necessary to select a material of as high resistance as possible. While, an ordinary black resin material is obtained by dispersing conductive material, there is a problem that its resistance value becomes low.

Especially, since a large amount of dispersion material is contained to raise the OD (Optical Density) value, a low resistance value becomes a problem. In this embodiment, as shown in FIG. 7, an opening portion 703 was formed in the black resin material 701 over a source wiring line 702, so that adjacent pixel electrodes were completely insulated and separated from each other. By this, it was possible to prevent cross-talk from occurring between the adjacent pixel electrodes.

This opening portion 703 was easily formed by etching the interlayer insulating film 701 using a pixel electrode 704 as a mask. Etching was carried out through dry etching with an oxygen plasma. In such a structure, since the opening portion 703 was positioned over the source wiring line 702 having light-shielding property, even if light streamed in through the opening portion 703, it did not reach a semiconductor layer (active layer).

Embodiment 3

Figure 8:
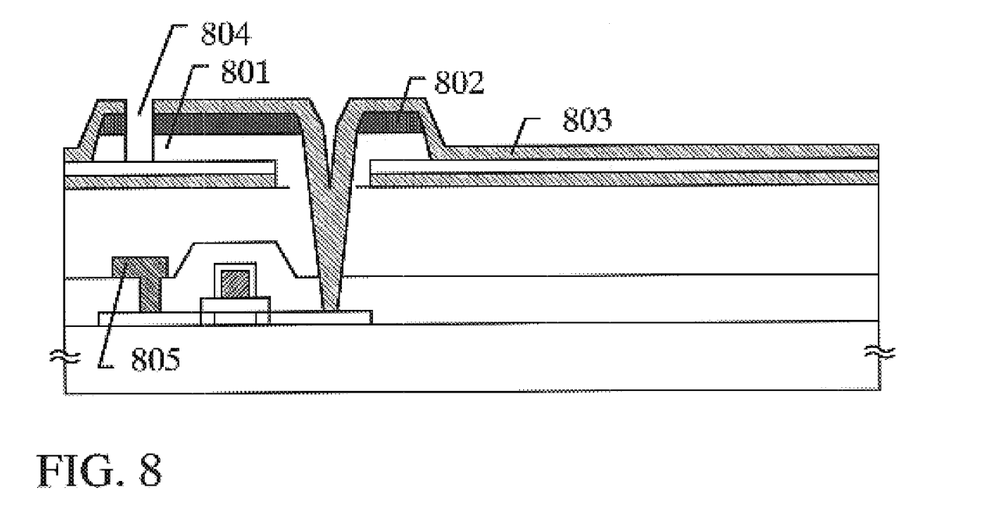
FIG. 8 is a view showing a sectional structure of a pixel and an auxiliary capacitance of Embodiment 3.

As shown in FIG. 8, in this embodiment, a laminated structure of a transparent resin material 801 and a black resin material 802 is adopted as an interlayer insulating film. Incidentally, the structure of this embodiment is the same as the embodiment 1 except that the insulating film 308 is changed into the laminated structure, and this embodiment can be easily combined with the embodiment 1.

In this embodiment, acryl was used for the transparent resin material 801, and acryl dispersed with titanium was used for the black resin material 802.

In this embodiment, since the resin material with a high titanium content was used, the sheet resistance value of the black resin material itself was as low as $1\times10^5$ $\Omega/\square$, however it was possible to realize higher light-shielding property by the high titanium content.

That is, since it is necessary to use the black resin material with low resistance value in order to give priority to the light-shielding property, this embodiment has a feature that the transparent resin material with a sheet resistance value about as high as $1\times10^{11}\Omega/\square$ is stacked in order to secure insulating property.

Also in the structure of this embodiment, similarly to the structure of FIG. 7, it is preferable to remove the black resin material 802 and the transparent resin material 801 using a pixel electrode as a mask to form an opening portion 804. At this time, it is also possible to make only the transparent resin material 801 remain. Of course, since light-shielding property is impaired at the opening portion 804, it is desirable to design such that the opening portion 804 is positioned over a source wiring line 805.

Embodiment 4

In this embodiment, the structure shown in FIG. 1 for setting the first transparent conductive film 104, which functions as the lower electrode of the auxiliary capacitance 109, to a common potential (ground potential) will be described with reference to FIG. 9.

Figure 9:
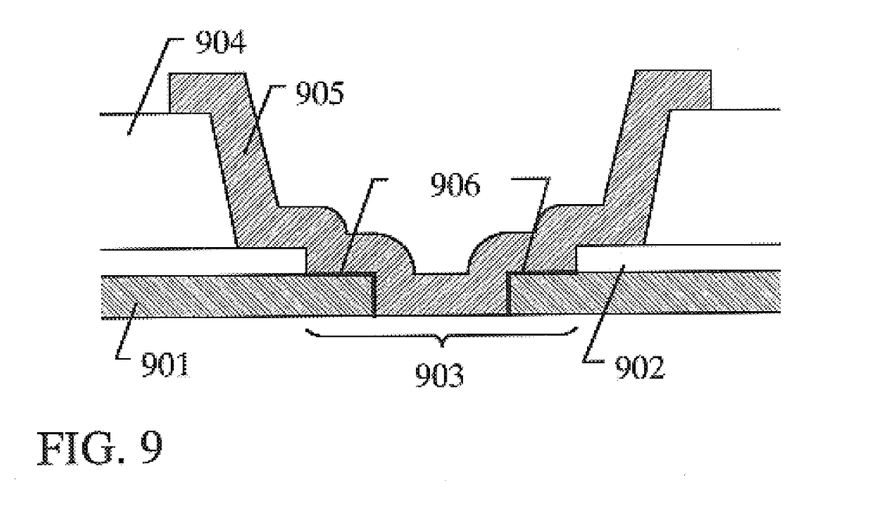
FIG. 9 is a view showing a sectional structure of a common contact portion of Embodiment 4.

FIG. 9 is an enlarged view showing a grounding pad provided outside of a picture display region (panel portion) of a liquid crystal display device. A first transparent conductive film 901 and a capacitance insulating film 902 include an opening portion 903. This opening portion 903 was formed at the same time as the step of FIG. 3C shown in the embodiment 1.

In the structure of this embodiment, it is important that when the opening portion 903 is formed, the end face of the capacitance insulating film 902 is retreated from the end face of the first transparent conductive film 901, so that a step-like opening portion is formed as shown in FIG. 9.

Reference numeral 904 denotes an interlayer insulating film made of a resin material, and a pad electrode 905 used as a common contact pad is formed of a second transparent conductive film thereon. This pad electrode 905 was formed at the same time as the step of FIG. 4B shown in the embodiment 1.

In the structure of this embodiment, by being the first transparent conductive film 901 in contact with the pad electrode 905 through a contact surface 906, the potential becomes the same. The pad electrode 905 is grounded so that the first transparent conductive film 901 is set to the ground potential.

Besides, this common contact pad is made to function as a pad for setting an counter electrode to the ground potential. A paste material mixed With conductive particles is formed on the pad electrode 905, and the active matrix substrate and the opposite substrate are bonded to each other in that state. According to this, the counter electrode provided on the opposite substrate is electrically connected to the pad electrode, and both the electrodes can be set to the ground potential.

Like this, when the transparent conductive film which is formed, as the pad electrode 905, in the same layer with the pixel electrode is used, it is effective because steps can be greatly simplified.

Incidentally, the structure of this embodiment can be combined with any embodiment of the embodiments 1 to 3.

Embodiment 5

In this embodiment, an example in which a step of removing a leveling film on a drain electrode of TFT is added, will be described with reference to FIGS. 10A to 10C.

First, the state of FIG. 3C was obtained in accordance with the steps of the embodiment 1. In the state of FIG. 3C, dry etching by an oxygen plasma was carried out. A part of the leveling film 303 made of a resin material was removed by using the capacitance insulating film 305 patterned by this etching as a mask. This state is shown in FIG. 10A.

Figure 10A:
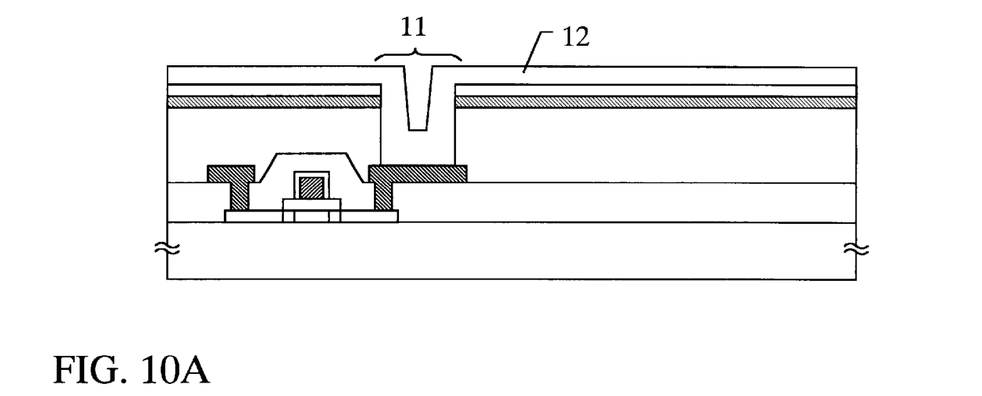
FIGS. 10A to 10C are views showing manufacturing steps of a pixel structure of Embodiment 5.

FIG. 10A shows the state in which an interlayer insulating film 12 made of a resin material (polyimide in this embodiment) was formed after a, dropped portion 11 was formed by a dry etching method. The opening width of the dropped portion 11 is roughly equal to the opening width of the opening portion 307 shown in FIG. 3C.

Figure 10B:
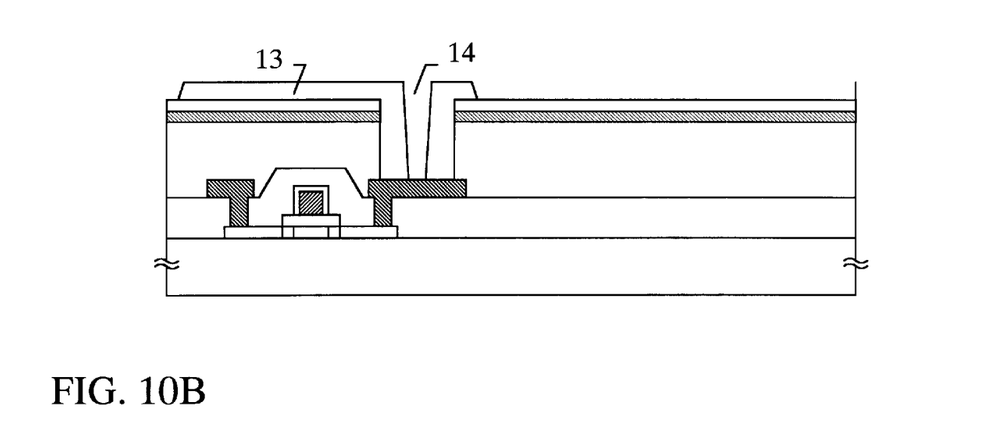
Figure 10C:
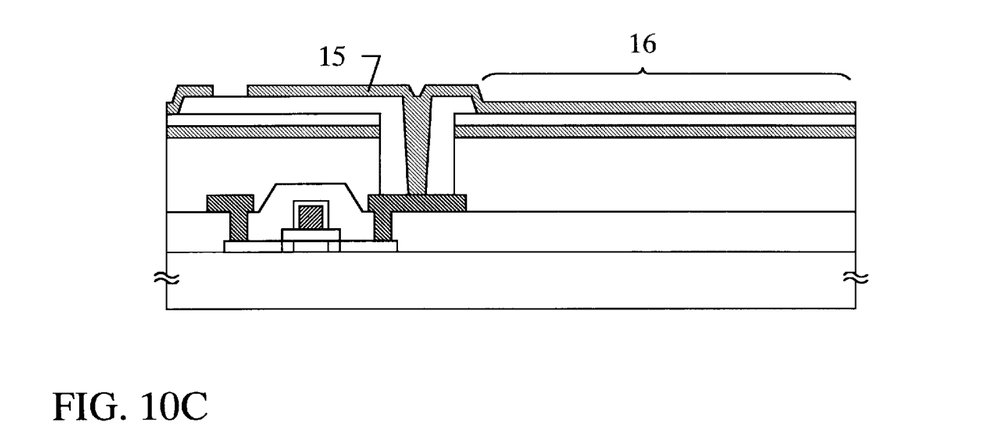

Then, the interlayer insulating film 12 was patterned to form a patterned interlayer insulating film 13, and at the same time, a contact hole 14 for connecting the pixel electrode and the TFT was formed (FIG. 10B).

After the contact hole 14 was formed in this way, a second transparent conductive film was formed and patterning was carried out, so that a pixel electrode 15 connected to the TFT was formed. At this time, an auxiliary capacitance 16 was also formed at the same time.

In the case of this embodiment, there is an advantage that the contact hole 14 can be formed by only etching of the same material.

For example, in the structure of the embodiment 1, it is assumed that such a combination is adopted that acryl is used as the leveling film 303, and polyimide is used for the interlayer insulating film 308. In this case, since acryl has a slightly faster etching rate, there is a fear that an eroded portion is formed under the first transparent conductive film 304, and there is danger of causing poor coverage of the pixel electrode, that is, poor quality of disconnection.

In that point, in the structure of this embodiment, since the contact hole is formed of completely the same material, there is no shape abnormality of the contact hole due to difference in the etching rate, and it is possible to prevent the poor quality of disconnection of the pixel electrode due to erosion or the like.

The structure of this embodiment can be combined with any of the embodiments 1 to 4. Even if this embodiment is combined with any structure, the effect to prevent the poor quality of disconnection of the pixel electrode due to the, shape of the contact hole is the same.

Embodiment 6

Electric apparatuses produced by Embodiments 1 through 5 of the present invention can be applied to a plurality of electro-optical devices (e.g. an active matrix type liquid crystal display, an active matrix type EL display, and an active matrix type EC display). That is, the present invention can be carried out for all the electric apparatus including such the electro-optical devices as display media.

As such electronic apparatus, a video camera, a digital camera, a projector (rear type or front type), a head mount display (a goggle type display), a car navigation system, a personal computer, a portable information terminal (mobile computer, portable telephone, electric book, etc.) and the like are enumerated. Examples of those are shown in FIG. 11A to FIG. 11F, FIG. 12A to FIG. 12D, and FIG. 13A to FIG. 13C.

Figure 11A:
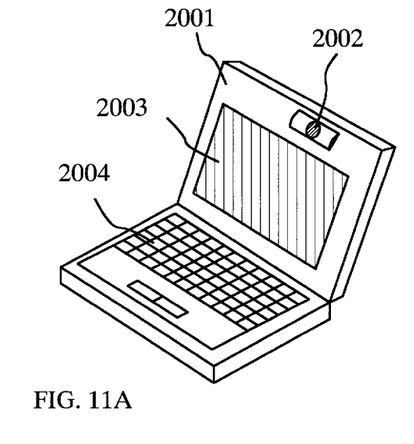
FIGS. 11A to 11F, 12A to 12D, and 13A to 13C are views showing examples of electronic apparatuses of Embodiment 6.

FIG. 11A shows a personal computer which is constituted by a main body 2001, an image input portion 2002, a display device 2003, and a keyboard 2004. The present invention can be applied to the image input portion 2002, the display device 2003, and other signal control circuits.

Figure 11B:
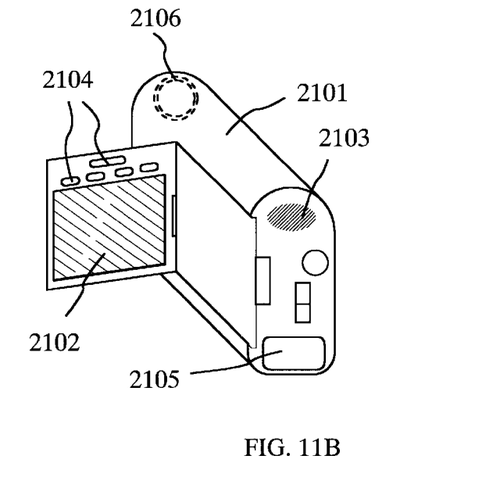

FIG. 11B shows a video camera which is constituted by a main body 2101, a display device 2102, an audio input portion 2103, an operation switch 2104, a battery 2105, and an image receiving portion 2106. The present invention can be applied to the display device 2102, the audio input portion 2103, and other signal control circuits.

Figure 11C:
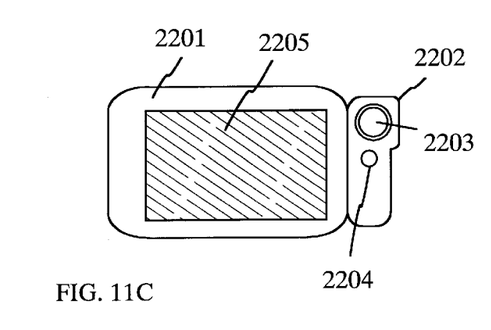

FIG. 11C shows a mobile computer which is constituted by a main body 2201, a camera portion 2202, an image receiving portion 2203, an operation switch 2204, and a display device 2205. The present invention can be applied to the display device 2205 and other signal control circuits.

Figure 11D:
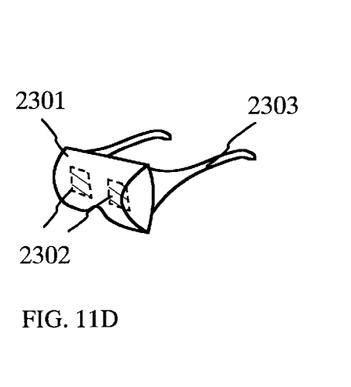

FIG. 11D shows a goggle type display which is constituted by a main body 2301, a display device 2302, and an arm portion 2303. The present invention can be applied to the display device 2302 and other signal control circuits.

Figure 11E:
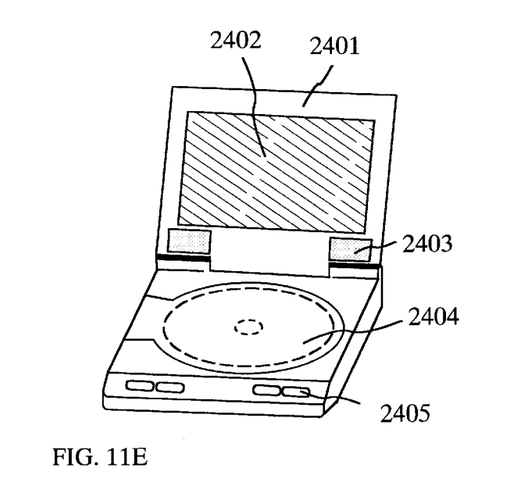

FIG. 11E shows a player apparatus which is equipped with a recording medium for recording a program (hereinafter, called "a recording medium"). The player apparatus is constituted by a main body 2401, a display device 2402, a speaker portion 2403, a recording medium 2404, an operation switch 2405 and an external input portion. This apparatus includes a DVD (digital Versatile Disc), a CD and the like as the recording medium for appreciating music and movie, playing a game, and Internet. The present invention can be applied to the display device 2402 and other signal control circuits.

Figure 11F:
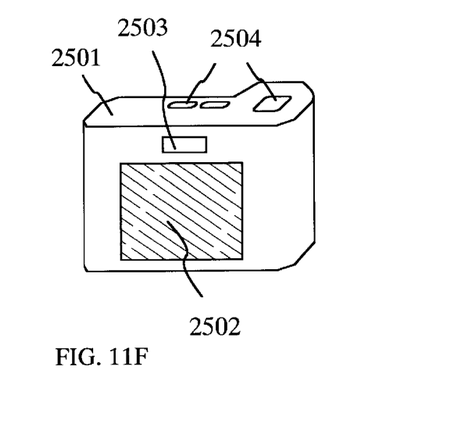

FIG. 11F shows a digital camera which is constituted by a main boy 2501, a display device 2502, an eyepiece portion 2503, an operation switch 2504 and an image receiving portion (not shown). The present invention can be applied to the display device 2502 and other signal control circuits.

Figures 12A, 12B, 12C:
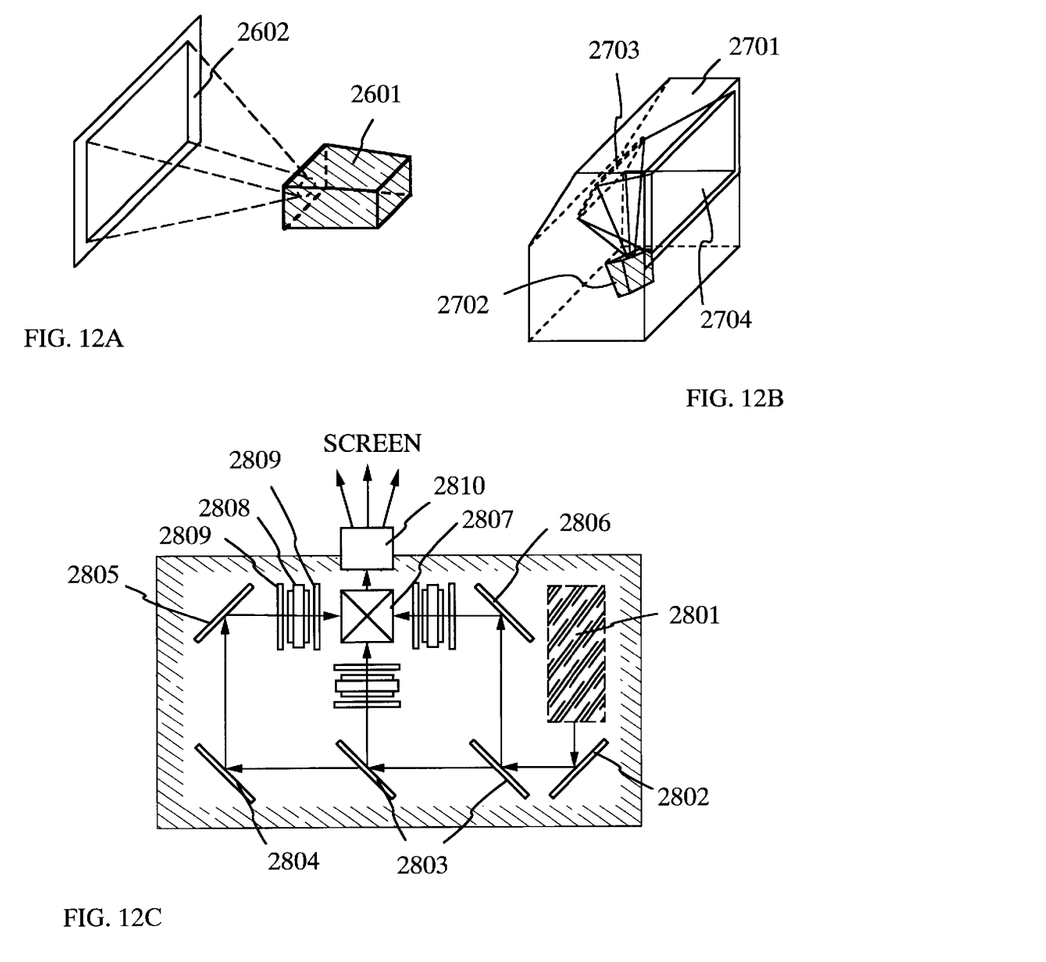

FIG. 12A shows a front type projector which is constituted by a light source optical system and a display device 2601, and a screen 2602. The present invention can be applied to the display device and other signal control circuits.

FIG. 12B shows a rear type projector which is constituted by a main body 2701, a light source optical system and a display device 2702, a mirror 2703 and a screen 2704. The present invention can be applied to the display device and other signal control circuits.

FIG. 12C shows an example structure of a light source optical system and a display device 2601 in FIG. 12A, or 2702 in FIG. 12B. Each of numerals 2601.and 2702 includes a light source optical system 2801, mirrors 2802, 2804–2806, a dichroic mirror 2803, another optical system 2807, a display device 2808, a phase difference plate 2809, and a projection optical system 2810. The projection optical system 2810 is constituted by a plurality of optical lenses equipped with a projection lens. Such a projection system as shown in FIG. 12C is called a three-plate type since this structure includes three plates of display devices. Further, it is proper for a researcher to form, in an optical path indicated by an arrow in FIG. 12C, an optical lens, a film with a polarizing characteristics, a film to control a phase difference, an IR film, etc.

Figure 12D:
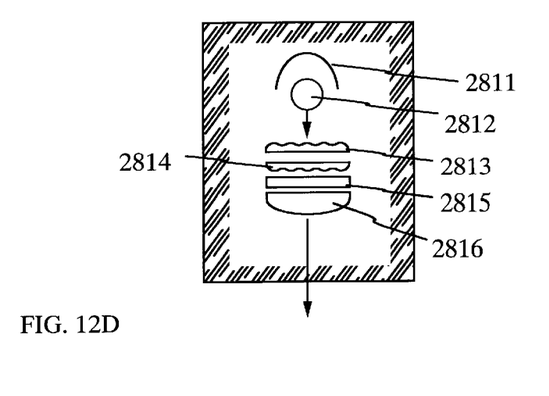

FIG. 12D shown an example structure of a light source optical system 2801 in FIG. 12C. In this embodiment, the light source optical system 2801 includes a reflector 2811, a light source 2812, lens arrays 2813 and 2814, a polarizing conversion element 2815 and a condenser lens 2816. However, the present invention is not specifically limited by this embodiment because it is just an example. For example, in an optical path, an optical lens, a film with a polarizing characteristics, a film to control a phase difference, an IR film, etc. can be properly formed.

Figure 13A:
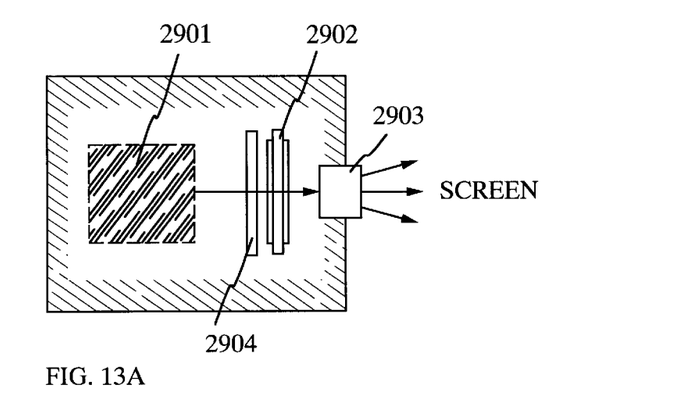

While FIG. 12C shows an example of the three-plate type, FIG. 13A shows an example of single-plate type. A light source optical system 2901, a display device 2902, a projection optical system 2903 are included in a light source optical system and a display device shown in FIG. 13A. It is possible to apply the light source optical system and display device shown in FIG. 13A to the light source optical system and display device 2601 shown in FIG. 12A, or 2702 in FIG. 12B. Further, the light source optical system 2901 can be applied by the light source optical system shown in FIG. 12D. In addition, the display device 2902 is equipped with a color filter (not shown), so that display image is colored.

Figure 13B:
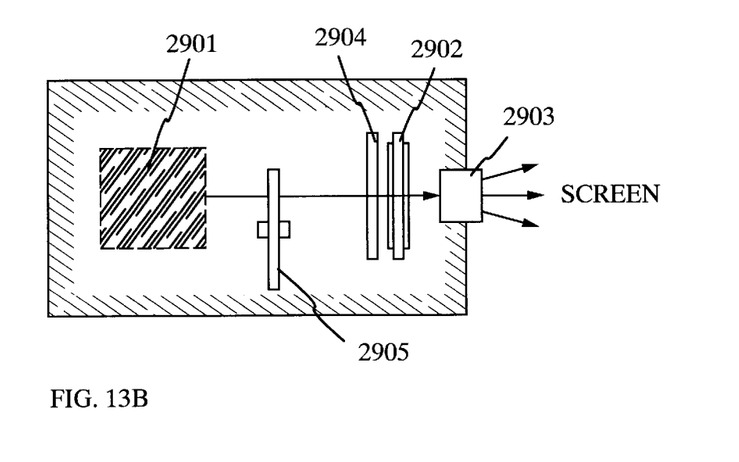

FIG. 13B shows an applied example of a light source optical system and a display device which is applied by FIG. 13A. Instead of forming a color filter, a display image is colored by RGB rotary color filter disc 2905. It is possible to apply the light source optical system and display device shown in FIG. 13B to the light source optical system and display device 2601 shown in FIG. 12A, or 2702 in FIG. 12B.

Figure 13C:
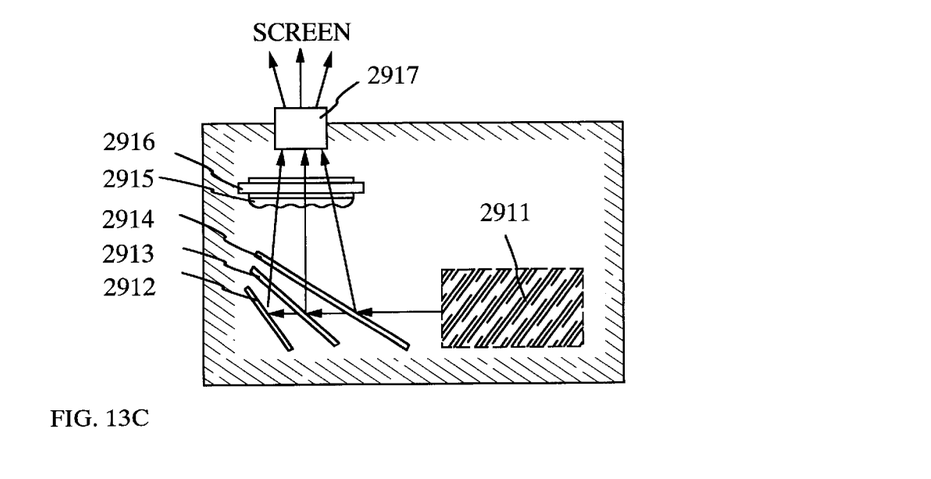

A structure of the light source optical system and display device, as shown in FIG. 13C is called as a color-filterless single-plate type. In this structure, a display device 2916 is equipped with a microlens array 2915, and a display image is colored by a dichroic mirror (Green) 2912, a dichroic mirror (Red) 2913 and a dichroic mirror (Blue). A projection optical system 2917 is constituted by a plurality of lenses including a projection lens. It is possible to apply the light source optical system and display device shown in FIG. 13C to the light source optical system and display device 2601 shown in FIG. 12A, or 2702 in FIG. 12B. Further, as the light source optical system 2911, an optical system having a coupling lens and a collimating lens other than a light source can be applied. apparatus in the instant invention can be realized by using any structure combined with Embodiments 1 through 5.

As described above, according to the present invention, since it becomes possible to freely set the thickness of a capacitance insulating film sandwiched between transparent conductive films, it becomes possible to use the entire pixel region as an auxiliary capacitance without impairing light transmittance in the pixel.

Thus, in the case where an active matrix type display device with a small pixel area and high definition is to be formed, it becomes possible to secure sufficient auxiliary capacitance. Even if the entire region in the pixel is made an auxiliary capacitance, since light transmittance is sufficiently high, bright picture display can be obtained. That is, it is possible to realize an electro-optical device with high definition and high quality, and an electronic apparatus incorporating such an electro-optical device.

What is claimed is:

1. A semiconductor device comprising:
   at least a thin film transistor formed on an insulating film;
   a first interlayer insulating film covering the thin film transistor;
   a first transparent conductive film formed on the first interlayer insulating film;
   a capacitance insulating film formed on the first transparent conductive film;
   an opening portion formed by patterning the first transparent conductive film and the capacitance insulating film;
   a second interlayer insulating film covering the opening portion and overlapping a portion of the first transparent conductive film and the capacitance insulating film;
   a contact hole formed in the first interlayer insulating film and the second interlayer insulating film to reach the thin film transistor;
   a second transparent conductive film formed on the capacitance insulating film and being electrically connected to the thin film transistor,
   wherein a capacitor is formed between the first and second transparent conductive films with the capacitance insulating film interposed therebetween,
   wherein the opening portion has a larger diameter than the contact hole.

2. A device according to claim 1, wherein the capacitance insulating film has a smaller thickness than the first transparent conductive film.

3. A device according to claim 1, wherein the capacitance insulating film is a transparent insulating film.

4. A device according to claim 1, wherein each of the first and second interlayer insulating films comprises a resin material.

5. A device according to claim 1, wherein the capacitance insulating film comprises one selected from the group consisting of silicon oxide, silicon nitride, silicon nitride oxide, tantalum oxide and aluminum oxide (alumina).

6. A device according to claim 1, wherein the capacitance insulating film has a thickness in a range of 10–200 nm.

7. A device according to claim 1, wherein the semiconductor device is one selected from the group consisting of an active matrix type liquid crystal display, an active matrix type EL display, and an active matrix type EC display.

8. A device according to claim 1, wherein the semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

9. A semiconductor device comprising:
   at least a thin film transistor formed on an insulating surface;
   a first interlayer insulating film covering the thin film transistor;
   a first transparent conductive film formed on the first interlayer insulating film;
   a capacitance insulating film formed on the first transparent conductive film;
   an opening portion formed in the first transparent conductive film and the capacitance insulating film;
   a second interlayer insulating film covering the opening portion and overlapping a portion of the first transparent conductive film and the capacitance insulating film;
   a contact hole formed in the first interlayer insulating film and the second interlayer insulating film to reach the thin film transistor;
   a second transparent conductive film formed on the capacitance insulating film and being electrically connected to the thin film transistor, wherein said second transparent conductive film extends over said second interlayer insulating film,
   wherein a capacitor is formed between the first and second transparent conductive films with the capacitance insulating film interposed therebetween,
   wherein the second interlayer insulating film comprises a light shielding resin material.

10. A device according to claim 9, wherein the second interlayer insulating film includes one selected from the group consisting of a light shielding resin film, and a laminated structure of a light shielding resin film and a transparent resin film.

11. A device according to claim 9, wherein a portion of the second interlayer insulating film is removed with the second transparent conductive film as a mask.

12. A device according to claim 9, wherein the capacitance insulating film has a smaller thickness than the first transparent conductive film.

13. A device according to claim 1, wherein the capacitance insulating film is a transparent insulating film.

14. A device according to claim 9, wherein each of the first and second interlayer insulating films comprises a resin material.

15. A device according to claim 9, wherein the capacitance insulating film comprises one selected from the group consisting of silicon oxide, silicon nitride, silicon nitride oxide, tantalum oxide and aluminum oxide (alumina).

16. A device according to claim 9, wherein the capacitance insulating film has a thickness in a range of 10–200 nm.

17. A device according to claim 9, wherein the semiconductor device is one selected from the group consisting of an active matrix type liquid crystal display, an active matrix type EL display, and an active matrix type EC display.

18. A device according to claim 9, wherein the semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

19. A semiconductor device comprising:
   at least a thin film transistor formed on an insulating surface;
   a first interlayer insulating film covering the thin film transistor;
   a first transparent conductive film formed on the first interlayer insulating film;
   a capacitance insulating film formed on the first transparent conductive film;
   an opening portion formed by patterning the first transparent conductive film and the capacitance insulating film;
   a second interlayer insulating film covering the opening portion and overlapping a portion of the first transparent conductive film and the capacitance insulating film;
   a contact hole formed in the first interlayer insulating film and the second interlayer insulating film to reach the thin film transistor;
   a second transparent conductive film formed on the capacitance insulating film and being electrically connected to the thin film transistor,
   wherein a capacitor is formed between the first and second transparent conductive films with the capacitance insulating film interposed therebetween,
   wherein the opening portion has a step-like shape.

20. A device according to claim 19, wherein each of the first and second interlayer insulating film comprises a resin material.

21. A device according to claim 19, wherein the capacitance insulating film is a transparent insulating film.

22. A device according to claim 19, wherein the capacitance insulating film comprises one selected from the group consisting of silicon oxide, silicon nitride, silicon nitride oxide, tantalum oxide and aluminum oxide (alumina).

23. A device according to claim 19, wherein the capacitance insulating film has a thickness in a range of 10–200 nm.

24. A device according to claim 19, wherein the semiconductor device is one selected from the group consisting of an active matrix type liquid crystal display, an active matrix type EL display, and an active matrix type EC display.

25. A device according to claim 19, wherein the semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

26. A semiconductor device comprising:
   at least a thin film transistor formed on an insulating film;
   a first interlayer insulating film covering the thin film transistor;
   a first transparent conductive film formed on the first interlayer insulating film;
   a capacitance insulating film formed on the first transparent conductive film;
   an opening portion formed in the first transparent conductive film and the capacitance insulating film;
   a second interlayer insulating film covering the opening portion and overlapping a portion of the first transparent conductive film and the capacitance insulating film;
   a contact hole formed in the first interlayer insulating film and the second interlayer insulating film to reach the thin film transistor;
   a second transparent conductive film formed on the capacitance insulating film and being electrically connected to the thin film transistor,
   wherein a capacitor is formed between the first and second transparent conductive films with the capacitance insulating film interposed therebetween,
   wherein the first transparent conductive film and the capacitance insulating film have a same pattern shape.

27. A device according to claim 26, wherein the capacitance insulating film has a smaller thickness than the first transparent conductive film.

28. A device according to claim 26, wherein the capacitance insulating film is a transparent insulating film.

29. A device according to claim 26, wherein the capacitance insulating film comprises one selected from the group consisting of silicon oxide, silicon nitride, silicon nitride oxide, tantalum oxide and aluminum oxide (alumina).

30. A device according to claim 26, wherein the capacitance insulating film has a thickness in a range of 10–200 nm.

31. A device according to claim 26, wherein the semiconductor device is one selected from the group consisting of an active matrix type liquid crystal display, an active matrix type EL display, and an active matrix type EC display.

32. A device according to claim 26, wherein the semiconductor device is one selected from the group consisting of a video camera, a digital camera, a projector (rear type or front type), a head mount display (a goggle type display), a car navigation system, a personal computer, a portable information terminal such as a mobile computer, a portable telephone, or an electric book.

* * * * *

UNITED STATES PATENT AND TRADEMARK OFFICE
CERTIFICATE OF CORRECTION

PATENT NO. : 6,690,031 B1
DATED : February 10, 2004
INVENTOR(S) : Hisashi Ohtani et al.

It is certified that error appears in the above-identified patent and that said Letters Patent is hereby corrected as shown below:

<u>Title page,</u>
Item [73], Assignee, after "Kanagawa-ken (JP)" insert -- Sharp Kabushiki Kaisha, Osaka (JP) --.

Signed and Sealed this

Thirteenth Day of July, 2004

JON W. DUDAS
*Acting Director of the United States Patent and Trademark Office*